(12) United States Patent
Jia et al.

(10) Patent No.: US 11,825,682 B2
(45) Date of Patent: Nov. 21, 2023

(54) ORGANIC LIGHT-EMITTING DIODE DISPLAY PANEL, MANUFACTURING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Wenbin Jia, Beijing (CN); Yikun Dou, Beijing (CN); Huifeng Wang, Beijing (CN); Li Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 93 days.

(21) Appl. No.: 16/082,402

(22) PCT Filed: Jan. 11, 2018

(86) PCT No.: PCT/CN2018/072214
§ 371 (c)(1),
(2) Date: Sep. 5, 2018

(87) PCT Pub. No.: WO2019/000911
PCT Pub. Date: Jan. 3, 2019

(65) Prior Publication Data
US 2021/0226158 A1    Jul. 22, 2021

(30) Foreign Application Priority Data
Jun. 26, 2017  (CN) .......................... 201710494355.4

(51) Int. Cl.
*C03C 17/34*    (2006.01)
*H10K 50/844*    (2023.01)
(Continued)

(52) U.S. Cl.
CPC ........... *H10K 50/844* (2023.02); *H10K 71/00* (2023.02); *H10K 77/111* (2023.02); *B82Y 20/00* (2013.01);
(Continued)

(58) Field of Classification Search
CPC . H01L 51/5253; H01L 51/56; H01L 51/0097; H01L 2251/5369; B82Y 30/00; B82Y 20/00
See application file for complete search history.

(56) References Cited

U.S. PATENT DOCUMENTS 6,433,944 B1 * 8/2002 Nagao .................... G11B 5/865
                                                        360/17
2004/0213954 A1 * 10/2004 Bourdelais ............. H05K 3/107
                                                        428/119
(Continued)

FOREIGN PATENT DOCUMENTS

CN        102169964 A      8/2011
CN        102201534 A      9/2011
(Continued)

OTHER PUBLICATIONS

International Search Report and Written Opinion for Application No. PCT/CN2018/072214, dated Apr. 12, 2018, 10 Pages.

*Primary Examiner* — Ali Naraghi
(74) *Attorney, Agent, or Firm* — BROOKS KUSHMAN P.C.

(57) ABSTRACT

An OLED display panel, a manufacturing method thereof and a display device are provided. The OLED display panel includes an OLED display substrate and an encapsulation layer for encapsulating the OLED display substrate. The OLED display substrate includes a flexible base substrate, and a TFT layer, a planarization layer and an OLED element layer arranged sequentially on the flexible base substrate. At least one layer of the encapsulation layer, and at least one of (Continued)

the flexible base substrate or the planarization layer, are polymer material layers each doped with flexible nanocomposite glass fibers.

7 Claims, 3 Drawing Sheets

(51) Int. Cl.
*H10K 71/00* (2023.01)
*H10K 77/10* (2023.01)
*B82Y 20/00* (2011.01)
*B82Y 30/00* (2011.01)
*H10K 102/00* (2023.01)

(52) U.S. Cl.
CPC ........ *B82Y 30/00* (2013.01); *H10K 2102/331* (2023.02)

(56) References Cited

U.S. PATENT DOCUMENTS

| | | | | |
|---|---|---|---|---|
| 2005/0154116 A1* | 7/2005 | Nagy | ........................ | C09D 5/18 524/492 |
| 2007/0072974 A1* | 3/2007 | Kobayashi | .............. | C08L 71/02 524/366 |
| 2010/0244085 A1* | 9/2010 | Xuan | ........................ | H01L 33/38 257/E33.062 |
| 2011/0175102 A1 | 7/2011 | Hatano | | |
| 2011/0200812 A1* | 8/2011 | Tomamoto | ............. | B65H 18/28 428/220 |
| 2012/0168765 A1 | 7/2012 | Kim et al. | | |
| 2014/0106141 A1* | 4/2014 | Bellman | .................. | C03C 17/34 428/201 |
| 2014/0329048 A1* | 11/2014 | Jung | ................... | H01L 51/5253 428/221 |
| 2015/0125829 A1* | 5/2015 | Hyman | .................. | G09B 11/10 434/81 |
| 2017/0062717 A1* | 3/2017 | Khachatryan | ........ | H10K 77/111 |
| 2018/0151646 A1* | 5/2018 | Kim | ...................... | H01L 27/3262 |
| 2018/0361704 A1* | 12/2018 | Jin | ......................... | B23K 26/38 |
| 2019/0011620 A1* | 1/2019 | Kuroda | ................... | H05B 33/02 |
| 2020/0203436 A1* | 6/2020 | Li | ........................... | H10K 71/80 |
| 2021/0039096 A1* | 2/2021 | Spero | .................... | H02K 37/24 |

FOREIGN PATENT DOCUMENTS

| | | | |
|---|---|---|---|
| CN | 107195666 A | 9/2017 | |
| JP | 2012227153 A | 11/2012 | |
| WO | WO 2017/096044 A1 * | 6/2017 | ............. B32B 7/027 |

* cited by examiner

ORGANIC LIGHT-EMITTING DIODE DISPLAY PANEL, MANUFACTURING METHOD THEREOF AND DISPLAY DEVICE

CROSS-REFERENCE TO RELATED APPLICATIONS

This application is the U.S. national phase of PCT Application No. PCT/CN2018/072214 filed on Jan. 11, 2018, which claims priority to Chinese Patent Application No. 201710494355.4 filed on Jun. 26, 2017, which are incorporated herein by reference in their entireties.

TECHNICAL FIELD

The present disclosure relates to the field of display technology, and in particular to an organic light-emitting diode display panel, a manufacturing method thereof, and a display device.

BACKGROUND

Along with the rising of the global information society and the development of the science and technology, the display technology has developed rapidly, and more and more display techniques have been proposed, such as, a conventional liquid crystal display technique, an organic light-emitting diode (OLED) display technique and an electrophoretic display technique. As compared with the other display devices, an OLED display device has such advantages as self-luminescence, rapid response, high brightness and wide viewing angle. In addition, due to the absence of liquid crystals, a flexible OLED display device, as a portable product, is capable of being curved, folded and even worn.

In practice, during use or bending test of the flexible OLED display device, an OLED element and other layers may be broken or separated from each other due to an oversized local stress in a bending process. As a result, water and oxygen may permeate through the OLED element, and thereby a service life of the OLED product may be affected.

SUMMARY

The present disclosure provides in some embodiments an OLED display panel, a manufacturing method thereof and a display device, so as to prevent service life of an OLED product from being affected by water and oxygen permeating through an OLED element when the OLED element and other films are broken or separated from each other due to an oversized local stress during bending of a conventional flexible OLED display device.

The present disclosure provides in at least one embodiment an OLED display panel, including an OLED display substrate and an encapsulation layer for encapsulating the OLED display substrate. The OLED display substrate includes a flexible base substrate, and a thin film transistor (TFT) layer, a planarization layer and an OLED element layer arranged sequentially on the flexible base substrate. At least one layer of the encapsulation layer, and at least one of the flexible base substrate or the planarization layer, are polymer material layers each doped with flexible nano-composite glass fibers.

The present disclosure further provides a display device including an OLED display panel. The OLED display panel includes an OLED display substrate and an encapsulation layer for encapsulating the OLED display substrate. The OLED display substrate includes a flexible base substrate, and a thin film transistor (TFT) layer, a planarization layer and an OLED element layer arranged sequentially on the flexible base substrate. At least one layer of the encapsulation layer, and at least one of the flexible base substrate or the planarization layer, are polymer material layers each doped with flexible nano-composite glass fibers.

The present disclosure further provides a method for manufacturing an OLED display panel, including: providing a substrate and forming a flexible base substrate on the substrate; forming a TFT layer, a planarization layer, an OLED element layer and an encapsulation layer sequentially on the flexible base substrate, wherein at least one layer of the encapsulation layer, and at least one of the flexible base substrate or the planarization layer, are polymer material layers each doped with flexible nano-composite glass fibers; and removing, the flexible base substrate, and the OLED element layer and the encapsulation layer on the flexible base substrate, from the substrate.

According to the OLED display panel, the manufacturing method thereof and the display device in the embodiments of the present disclosure, at least one layer of the encapsulation layer of the OLED display substrate, and at least one of the flexible base substrate or the planarization layer of the OLED display substrate, are each doped with flexible nano-composite glass fibers. In this way, the flexibility and the strength of the OLED display substrate, as well as those of the OLED display panel and the display device including the OLED display substrate, are improved, and the layers of the OLED display substrate are prevented from being broken or separated from each other during bending, thereby effectively improving the service life of the OLED display substrate as well as those of the OLED display panel and the display device including the OLED display substrate.

DETAILED DESCRIPTION

In order to make the addressed issues, the technical solutions and the advantages of the present disclosure more clear, the present disclosure will be described hereinafter in conjunction with the drawings and embodiments.

Figure 1:
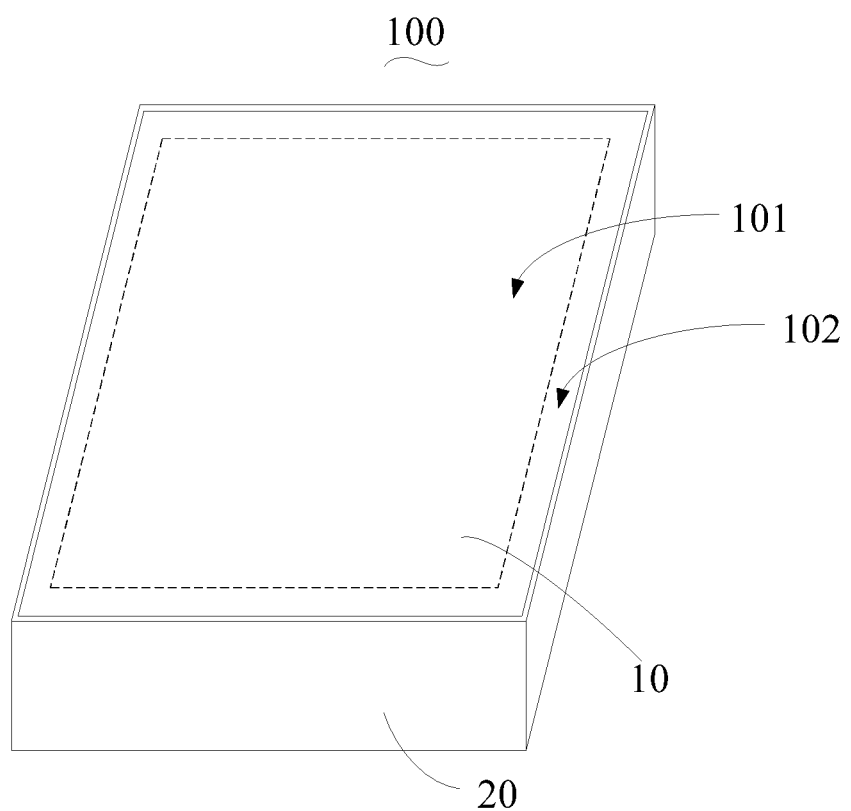
FIG. 1 is a solid view of a display device according to an embodiment of the present disclosure.
Figure 2:
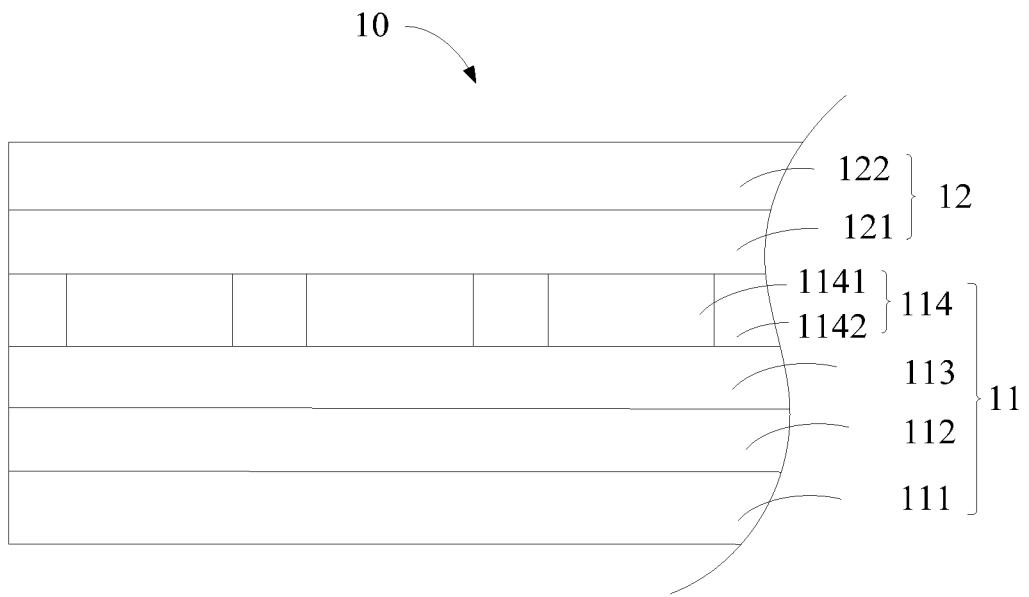
FIG. 2 is a schematic view showing an OLED display panel shown in FIG. 3.

Reference is made to FIG. 1 and FIG. 2. FIG. 1 is a solid view of a display device according to an embodiment of the present disclosure, and FIG. 2 is a schematic view showing an OLED display panel in FIG. 2. As shown in FIGS. 1 and 2, the display device 100 includes an OLED display panel 10 and a housing 20 for supporting the OLED display panel 10. Assemblies for the display device 100, such as, a circuit board and a cell, are provided within a cavity defined by the housing 20 and the OLED display panel 10. The display device 100 further includes a display region 101 and a peripheral region 102 surrounding the display region 101. The display region 101 is mainly for achieving a display output function of the display device 100, and the peripheral region 102 is mainly for arranging wires.

The OLED display panel 10 includes an OLED display substrate 11 and an encapsulation layer 12. The encapsulation layer 12 is configured to encapsulate the OLED display substrate 11, so as to protect the OLED display substrate 11.

The OLED display substrate 11 includes a flexible base substrate 111, a TFT layer 112, a planarization layer 113 and an OLED element layer 114. The TFT layer 112, the planarization layer 113 and the OLED element layer 114 are arranged on the flexible base substrate 111. The TFT layer 112 is arranged between the flexible base substrate 111 and the planarization layer 113, and the OLED element layer 114 is arranged at a side of the planarization layer 113 away from the TFT layer 112.

In a possible embodiment of the present disclosure, the flexible base substrate 111 may be made of flexible polymer material, such as, polyethylene terephthalate (Polyethylene Terephthalate, PET), polyethylene naphthalate (Polyethylene Naphthalate, PEN), polycarbonate (Polycarbonate, PC), polyether sulfone (Polyether Sulfone, PES), polyimide (Polyimide, PI), or fiber reinforced plastic (Fiber Reinforced Plastic, FRP).

The TFT layer 112 includes multiple TFTs arranged in a matrix form. The OLED element layer 114 includes multiple OLED elements 1141 arranged in a matrix form and multiple spacers 1142. The spacer 1142 is arranged between two adjacent OLED elements 1141.

In some possible embodiments of the present disclosure, pixel electrodes may be further arranged on the flexible base substrate 111. The pixel electrodes may be arranged between the planarization layer 113 and the OLED element layer 114, and each pixel electrode may be electrically connected to a TFT through a via-hole in the planarization layer 113. In an embodiment, the OLED elements 1141 correspond to the pixel electrodes respectively, and each pixel electrode may serve as an anode of the corresponding OLED element 1141.

In some possible embodiments of the present disclosure, at least one layer of the encapsulation layer 12, and at least one of the flexible base substrate 111 or the planarization layer 113, are polymer material layers each doped with flexible nano-composite glass fibers. The at least one layer of the encapsulation layer 12 is doped with the flexible nano-composite glass fibers at a volume doping concentration greater than 30%, and the flexible base substrate 111 and/or the planarization layer 113 are doped with the flexible nano-composite glass fibers at a volume doping concentration of 30% to 60%.

In some possible embodiments of the present disclosure, the flexible base substrate 111, the planarization layer 113, and at least one layer of the encapsulation layer 12 are each doped with flexible nano-composite glass fibers. Since the encapsulation layer 12 is doped with the flexible nano-composite glass fibers, it is able to rapidly release a stress generated in an inorganic layer of the encapsulation layer 12 when the encapsulation layer 12 is bended. Since the flexible base substrate 111 is doped with the flexible nano-composite glass fibers, it is able to increase the flexibility of the base substrate and prevent the occurrence of cracks in the base substrate when the base substrate is bended. Since the planarization layer 113 is doped with the flexible nano-composite glass fibers, it is able to increase the flexibility of the planarization layer 113 and prevent rigid layers such as the pixel electrodes and metal from being broken or separated from each other when the planarization layer is bended.

In some possible embodiments of the present disclosure, the flexible base substrate 111 and/or the planarization layer 113 are doped with the flexible nano-composite glass fibers at a volume doping concentration of 50%.

In an embodiment of the present disclosure, the encapsulation layer 12 includes an inorganic material layer 121 and a stress dispersion layer 122. The inorganic material layer 121 is located between the OLED element layer 114 and the stress dispersion layer 122, and the present disclosure is not limited thereto. In some other embodiments of the present disclosure, in order to provide the encapsulation layer 12 with a better resistance to water and air, the encapsulation layer 12 may further include other layers, such as, a waterproof layer and an oxygen barrier layer.

In an embodiment of the present disclosure, the stress dispersion layer 122 is a polymer material layer doped with the flexible nano-composite glass fibers at a volume doping concentration greater than 30%.

In some possible embodiments of the present disclosure, the volume doping concentration of the flexible nano-composite glass fibers in the stress dispersion layer 122 may be 100%, i.e., the stress dispersion layer 122 is a layer of the flexible nano-composite glass fibers.

Figure 3:
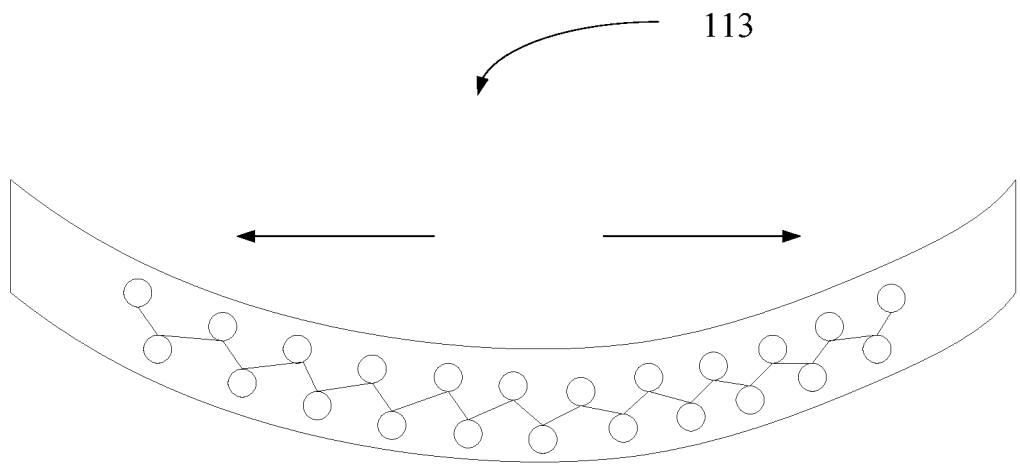
FIG. 3 is a schematic view showing a principle of stress dispersion in a planarization layer of an OLED display substrate shown in FIG. 2.

Reference is made to FIG. 3. FIG. 3 is a schematic view showing a principle of the stress dispersion in the planarization layer of the OLED display substrate shown in FIG. 2. When a conventional OLED display substrate is bended, a middle portion of the planarization layer is curved at a relatively large curvature radius and stresses are concentrated at the middle portion, so the planarization layer may easily be broken. For the OLED display substrate 11 in the embodiments of the present disclosure, the planarization layer 113 is doped with the flexible nano-composite glass fibers. The flexible nano-composite glass fibers are in a mesh-like form, which have such advantages as high elastic coefficient, high extensibility within their elastic limits, high tensile strength and high impact energy absorbability. Therefore, when the planarization layer 113 is bended, the stresses at the portion with a large curvature radius may be dispersed rapidly to other portions and hence may be reduced, the planarization layer 113 has even stress distribution, and the flexibility of the planarization layer 113 is improved, effectively preventing the planarization layer 113 from being broken.

In the embodiments of the present disclosure, the principle of the stress dispersion for the stress dispersion layer 122 and the flexible base substrate 111 is the same as that for the planarization layer 113, and thus will not be described herein.

Figure 4:
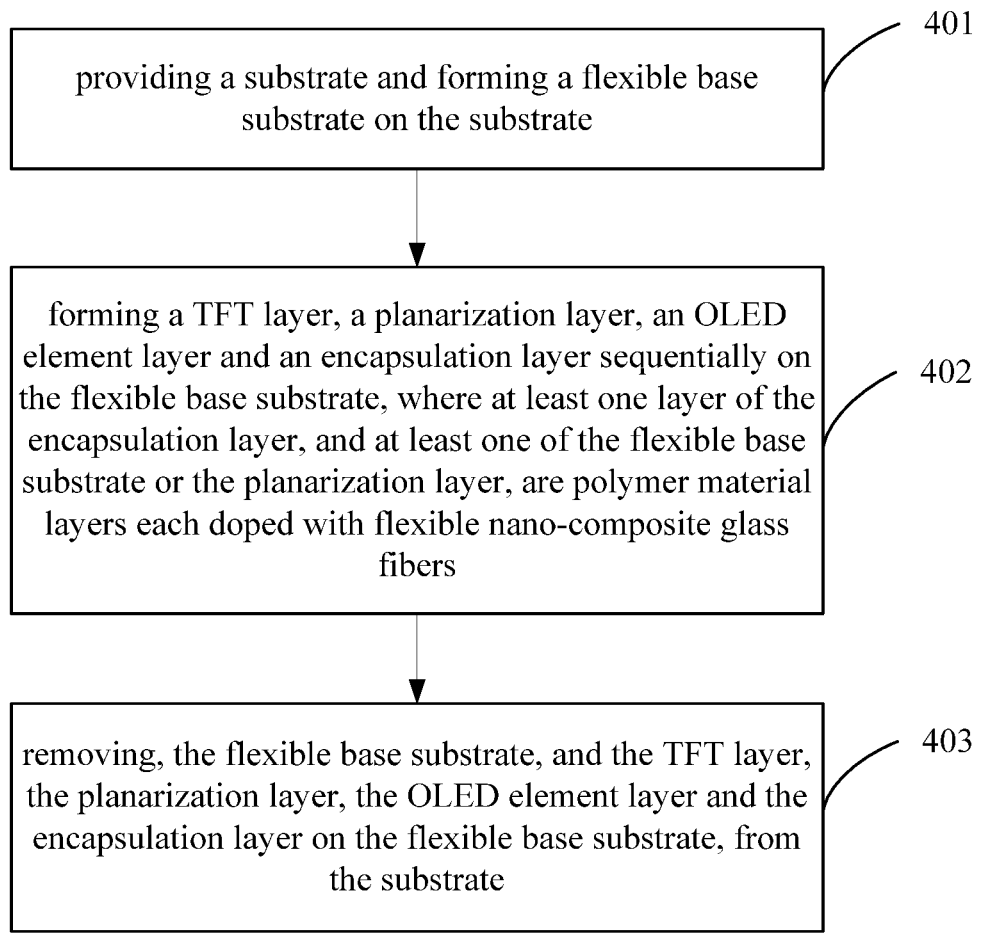
FIG. 4 is a flow chart of a method for manufacturing the OLED display panel shown in FIG. 2.

Correspondingly, the present disclosure further provides in an embodiment a method for manufacturing the OLED display panel according to the above embodiments. Reference is made to FIG. 4. FIG. 4 is a flow chart of a method for manufacturing the OLED display panel shown in FIG. 2. As shown in FIG. 4, the method includes steps 401 to 403.

In step 401, a substrate is provided, and a flexible base substrate is formed on the substrate.

The flexible base substrate of the OLED display panel is made of flexible polymer material, so the substrate may be provided at first in the step to support the subsequently-formed flexible base substrate. The flexible base substrate is formed on the substrate. The substrate may be a rigid substrate.

In step 402, a TFT layer, a planarization layer, an OLED element layer and an encapsulation layer are formed sequentially on the flexible base substrate. At least one layer of the encapsulation layer, and at least one of the flexible base substrate or the planarization layer, are polymer material layers each doped with flexible nano-composite glass fibers.

In this step, after the formation of the flexible base substrate, the TFT layer, the planarization layer, the OLED element layer and the encapsulation layer may be sequentially formed on the flexible base substrate through corresponding processes.

At least one layer of the encapsulation layer, and at least one of the flexible base substrate or the planarization layer, are polymer material layers each doped with the flexible nano-composite glass fibers.

In step 403, the flexible base substrate, and the TFT layer, the planarization layer, the OLED element layer and the encapsulation layer on the flexible base substrate, are removed from the substrate.

In this step, after the sequential formation of the TFT layer, the planarization layer, the OLED element layer and the encapsulation layer on the flexible base substrate, the flexible base substrate, and the TFT layer, the planarization layer, the OLED element layer and the encapsulation layer on the flexible base substrate may be removed from the substrate, so as to acquire the OLED display panel.

In some possible embodiments of the present disclosure, the flexible base substrate and/or the planarization layer may be doped with the flexible nano-composite glass fibers at a volume doping concentration of 30% to 60%.

In some possible embodiments of the present disclosure, the encapsulation layer includes an inorganic material layer and a stress dispersion layer. The inorganic material layer is located between the OLED element layer and the stress dispersion layer, and the stress dispersion layer is a polymer material layer doped with the flexible nano-composite glass fibers.

In some possible embodiments of the present disclosure, the stress dispersion layer may be doped with the flexible nano-composite glass fibers at a volume doping concentration greater than 30%.

According to the OLED display panel, the manufacturing method thereof and the display device in the embodiments of the present disclosure, at least one of the flexible base substrate or the planarization layer of the OLED display substrate is doped with flexible nano-composite glass fibers. In the OLED display panel and the display device including the OLED display substrate, at least one layer of the encapsulation layer of the OLED display substrate, and at least one of the flexible base substrate or the planarization layer of the OLED display substrate, are each doped with flexible nano-composite glass fibers. In this way, the flexibility and the strength of the OLED display substrate, as well as those of the OLED display panel and the display device including the OLED display substrate, are improved, and the layers of the OLED display substrate are prevented from being broken or separated from each other during bending, thereby effectively improving the service life of the OLED display substrate as well as those of the OLED display panel and the display device including the OLED display substrate.

The above are merely some embodiments of the present disclosure. It should be noted that, a person skilled in the art may make further modifications and improvements without departing from the principle of the present disclosure, and these modifications and improvements shall also fall within the scope of the present disclosure.

What is claimed is:

1. An organic light-emitting diode (OLED) display panel, comprising an OLED display substrate and an encapsulation layer for encapsulating the OLED display substrate,
    wherein the OLED display substrate comprises a flexible base substrate, a thin film transistor (TFT) layer, a planarization layer and an OLED element layer arranged sequentially on the flexible base substrate, and
    wherein at least one layer of the encapsulation layer, and at least one of the flexible base substrate or the planarization layer, are polymer material layers each doped with flexible nano-composite glass fibers;
    the TFT layer has a first surface facing the flexible base substrate and a second surface away from the flexible base substrate, and the first surface and the second surface of the TFT layer are arranged at two opposite sides of the TFT layer respectively, and the planarization layer is on the second surface of the TFT layer;
    wherein the encapsulation layer comprises an inorganic material layer and a stress dispersion layer, the inorganic material layer is arranged between the OLED element layer and the stress dispersion layer, and the stress dispersion layer is a polymer material layer doped with the flexible nano-composite glass fibers.

2. The OLED display panel according to claim 1, wherein the stress dispersion layer is doped with the flexible nano-composite glass fibers at a volume doping concentration greater than 30%.

3. A display device, comprising the OLED display panel according to claim 1.

4. The OLED display panel according to claim 1, wherein at least one of the flexible base substrate or the planarization layer is made of organic material.

5. A method for manufacturing an OLED display panel, comprising:
    providing a substrate and forming a flexible base substrate on the substrate;
    forming a TFT layer, a planarization layer, an OLED element layer and an encapsulation layer sequentially on the flexible base substrate, wherein at least one layer of the encapsulation layer, and at least one of the flexible base substrate or the planarization layer, are polymer material layers each doped with flexible nano-composite glass fibers; and
    removing, the flexible base substrate, and the TFT layer, the planarization layer, the OLED element layer and the encapsulation layer on the flexible base substrate, from the substrate;
    the TFT layer has a first surface facing the flexible base substrate and a second surface away from the flexible base substrate, and the first surface and the second surface of the TFT layer are arranged at two opposite sides of the TFT layer respectively, and the planarization layer is on the second surface of the TFT layer;
    wherein the encapsulation layer comprises an inorganic material layer and a stress dispersion layer, the inorganic material layer is arranged between the OLED element layer and the stress dispersion layer, and the stress dispersion layer is a polymer material layer doped with the flexible nano-composite glass fibers.

6. The method according to claim 5, wherein the stress dispersion layer is doped with the flexible nano-composite glass fibers at a volume doping concentration greater than 30%.

7. The method according to claim 5, wherein at least one of the flexible base substrate or the planarization layer is made of organic material.

* * * * *